(12) United States Patent
Teper et al.

(10) Patent No.: US 8,661,329 B1
(45) Date of Patent: Feb. 25, 2014

(54) GENERATION OF READABLE HIERARCHICAL PATH IDENTIFIERS

(75) Inventors: Mark Ari Teper, Toronto (CA); Przemek Guzy, Richmond Hill (CA); Steven Caranci, Toronto (CA)

(73) Assignee: Altera Corporation, San Jose, CA (US)

( * ) Notice: Subject to any disclaimer, the term of this patent is extended or adjusted under 35 U.S.C. 154(b) by 598 days.

(21) Appl. No.: 12/732,110

(22) Filed: Mar. 25, 2010

(51) Int. Cl.
*G06F 3/00* (2006.01)

(52) U.S. Cl.
USPC ......................................................... 715/211

(58) Field of Classification Search
USPC ........................... 715/211, 234, 243, 254, 255
See application file for complete search history.

(56) References Cited

U.S. PATENT DOCUMENTS

| | | | |
|---|---|---|---|
| 6,635,088 B1 * | 10/2003 | Hind et al. | 715/236 |
| 2003/0037232 A1 * | 2/2003 | Bailiff | 713/153 |
| 2003/0101277 A1 * | 5/2003 | Crump | 709/238 |
| 2004/0267961 A1 * | 12/2004 | Dietz et al. | 709/245 |
| 2009/0326886 A1 * | 12/2009 | Arbel et al. | 703/6 |

OTHER PUBLICATIONS

"How Windows Generates 8.3 File Names from Long File Names," Jan. 19, 2007, <available from: http://www.support.microsoft.com/kb/142982>, pp. 1-2.*

* cited by examiner

*Primary Examiner* — Kyle Stork
(74) *Attorney, Agent, or Firm* — Weaver Austin Villeneuve & Sampson LLP

(57) ABSTRACT

A system evaluates a hierarchical name set such as names produced by hardware descriptor language (HDL) synthesis and generates shorter, unambiguous names for each of the hierarchical names in the name set. A directed graph and/or a tree is generated using a hierarchical name set. Each name is evaluated using the directed graph and/or tree to identify hierarchical components or tokens of the name required in the short name. Name length can be reduced even in a system having large numbers of common hierarchies.

11 Claims, 6 Drawing Sheets

GENERATION OF READABLE HIERARCHICAL PATH IDENTIFIERS

TECHNICAL FIELD

The present disclosure relates to generation of human readable hierarchical path names and identifiers.

DESCRIPTION OF RELATED ART

Constructs such as design entities, file systems, and paths often have hierarchically concatenated identifiers or names. For example, a design entity in a hardware descriptor language may have component level concatenated to construct a name. The name constructed is often difficult for human comprehension. Modern designs can contain names that can contain more than 200 characters. Reading these names and understanding how each fit into the design is difficult.

Displaying long names on computer monitors is also problematic. Consequently, it is desirable to provide improved mechanisms for generating readable hierarchical path names and identifiers.

BRIEF DESCRIPTION OF THE DRAWINGS

The disclosure may best be understood by reference to the following description taken in conjunction with the accompanying drawings, which illustrate particular embodiments of the present invention.

DESCRIPTION OF PARTICULAR EMBODIMENTS

Figure 1:
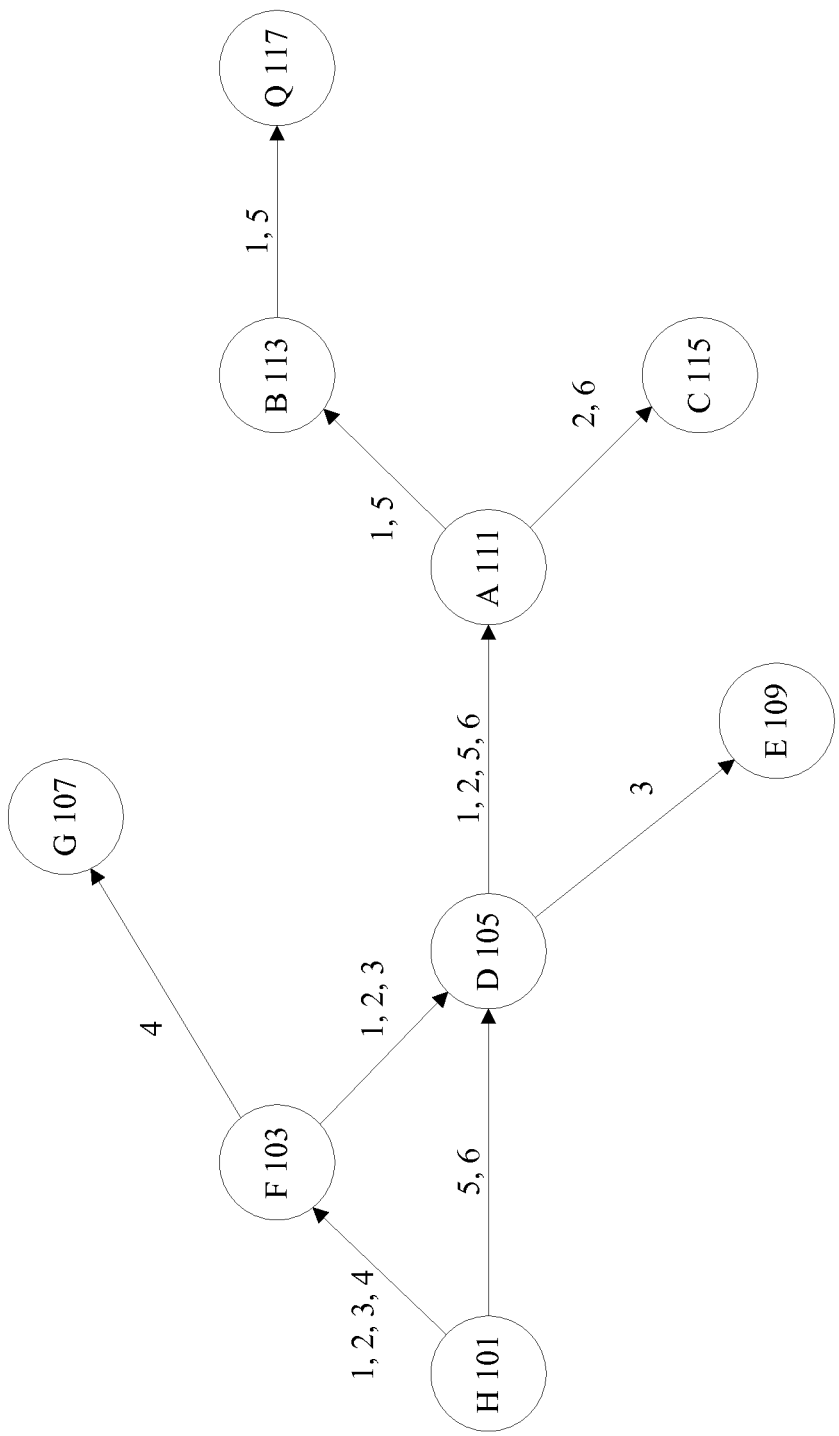
FIG. 1 illustrates one example of a directed graph.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of design entities in hardware descriptor languages (HDL). However, it should be noted that the techniques of the present invention can be applied to a number of schemes such as routes, paths, file systems, classification schemes, etc. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise. For example, a processor is used in a variety of contexts. However, it will be appreciated that multiple processors can also be used while remaining within the scope of the present invention unless otherwise noted. Furthermore, the techniques and mechanisms of the present invention will sometimes describe two entities as being connected. It should be noted that a connection between two entities does not necessarily mean a direct, unimpeded connection, as a variety of other entities may reside between the two entities. For example, a processor may be connected to memory, but it will be appreciated that a variety of bridges and controllers may reside between the processor and memory. Consequently, a connection does not necessarily mean a direct, unimpeded connection unless otherwise noted.

Overview

A system evaluates a hierarchical name set such as names produced by hardware descriptor language (HDL) synthesis and generates shorter, unambiguous names for each of the hierarchical names in the name set. A directed graph and/or a tree is generated using a hierarchical name set. Each name is evaluated using the directed graph and/or tree to identify hierarchical components or tokens of the name required in the short name. Name length can be reduced even in a system having large numbers of common hierarchies.

Example Embodiments

Many systems have long hierarchical names used to identify particular entities. For example, a file in a file system may be identified with /user/njt/system/os/version8.2.1/lib/binary/test. In another example, a name produced by hardware descriptor language (HDL) synthesis may be identified with |test_design|test_design_core:design_core|cpu4_out:cpu4_out|tx__128:cpu4_out_tx_a|tx__128system_bus_at|top|tx__128system_bus_system_bus_wrside:system_bus_topram_addr [0]. In still another example, a destination may be identified as a route through nodes such as node324|node432|node894|node873|node239|node837|node943. Each of these hierarchical identification schemes provides a unique identifier of an entity such as a file, design, or path. However, each of these hierarchical identifiers can be unwieldy and difficult to comprehend.

Some efforts have been made to create aliases or mappings to particular files. For example, the file pointer my test might be aliased or mapped to /user/njt/system/os/version8.2.1/lib/binary/test. The user would not need to know the hierarchical name for the file that my_test aliases. However, the alias my_test provides very little information included in the hierarchical name. For example, a user only knowing the alias my_test would not know that the file is associated with a system os version 8.2.1.

It is also contemplated that hierarchical names such as file names, design entity names, classification names, and path names can be compressed. For example, if it is determined that numerous routes include the subpath node432|node894|node873, the node432|node894|node873 sequence could be replaced with a compressed string such as subpathX. However, compression and deduplication schemes also lose important information and can adversely affect readability of the hierarchical name.

Consequently, the techniques and mechanisms of the present invention intelligently analyze a name set and evaluate directed graphs and/or trees generated using the name set.

According to various embodiments, a name generation system works backward from the end of a hierarchical name to identify the sections of the name which are needed to keep the short name identifiable and unique. In particular embodiments, the algorithm starts with a search string that would match every name in the design. It then works backwards from the end of a name working one token or hierarchy level at a time and attempts to determine if adding a particular token or hierarchy level to the short name reduces the number of names that match.

In one particular example, the original name |test_design|test_design_core:design_core|cpu4_out:cpu4_out|tx_128:cpu4_out_tx_a|tx_128system_bus_at|top|tx_128system_bus_system_bus_wrside:system_bus_topram_addr[0] becomes the short name . . . |cpu4_out_tx_a| . . . |system_bus_topram_addr[0].

The hierarchical name generation mechanism allows users to quickly parse the names in a complex design. Display of long names in graphical tools is simplified and short names can be used in a wildcard search to match exactly with just the specified node. Unambiguous shortened node names can be generated on-demand one at a time. Name length can be reduced even with large numbers of common hierarchies Hierarchical names typically include separators such as character strings (".", "|", "_") that can be used to delimitate logically important parts of a hierarchical name. Each section or part of the name between separators is referred to herein as a token or hierarchical level or hierarchical component. A wildcard is a string used in the produced name to indicate that this section can be replaced by any token, or any number of tokens to produce the original name.

According to various embodiments, a hierarchical name generation system evaluates a names set or the set of all names that are produced during synthesis to convert original names into short names. Short names are unambiguous shorter name produced by the hierarchical name generation system.

In order to produce short names, two data structures are used. According to various embodiments, a directed graph and a tree are used. The tree data structure matches the hierarchy found in the names set. The graph is generated by labeling each entity in the name set with an identifier such as a number. One node in the graph is created for each unique token that exists in the name set. In particular embodiments, an algorithm iterates over all the names in the names set and connections in the graph are labeled with numbers corresponding to entities that include tokens linked by the connections.

FIG. 1 illustrates one example of a directed graph that can be generated using the name set. According to various embodiments, the name set of all names that are produced during synthesis includes HFDABQ, HFDAC, HFDE, HFG, HDABQ, and HDAC. Each of the names in the name set is referred to herein as an original name. Each element in the original name is a token. For example, H, F, D, A, B, and Q are tokens in the original name HFDABQ. The tokens may be delimited using separators such as | or -.

In one example, the name set is labeled in the following manner.

1—HFDABQ
2—HFDAC
3—HFDE
4—HFG
5—HDABQ
6—HDAC

In particular embodiments, nodes 101, 103, 105, 107, 109, 111, 113, 115, and 117 are created in a directed graph. Nodes 101, 103, 105, 107, 109, 111, 113, 115, and 117 correspond to tokens H, F, D, G, E, A, B, C, and Q respectively. Original name 1 (HFDABQ) has adjacent nodes HF, FD, DA, AB, and BQ. The links between are labeled with the names that have adjacent pairs of tokens in the names. According to various embodiments, adjacent nodes H 101 and F 103 are included in names 1, 2, 3, and 4 and the link between nodes H 101 and F 103 is labeled with names 1, 2, 3, and 4. Adjacent nodes F 103 and G 107 are included in name 4 and the link between nodes F 103 and G 107 is labeled with name 4. Adjacent nodes F 103 and D 105 are included in names 1, 2, and 3 and the link between nodes F 103 and D 105 is labeled with names 1, 2, and 3. Adjacent nodes H 101 and D 105 are included in names 5 and 6 and the link between nodes H 101 and D 105 is labeled with the names 5 and 6. Adjacent nodes D 105 and A 111 are included in names 1, 2, 5 and 6 and the link between nodes D 105 and A 111 is labeled with the names 1, 2, 5 and 6. Adjacent nodes D 105 and E 109 are included in name 3 and the link between nodes D 105 and E 109 is labeled with name 3. Adjacent nodes A 111 and B 113 are included in names 1 and 5 and the link between nodes A 111 and B 113 is labeled with the names 1 and 5. Adjacent nodes B 113 and Q 117 are included in names 1 and 5 and the link between nodes B 113 and Q 117 is labeled with the names 1 and 5. Adjacent nodes A 111 and C 115 are included in names 2 and 6 and the link between nodes A 111 and C 115 is labeled with the names 2 and 6.

Figure 2:
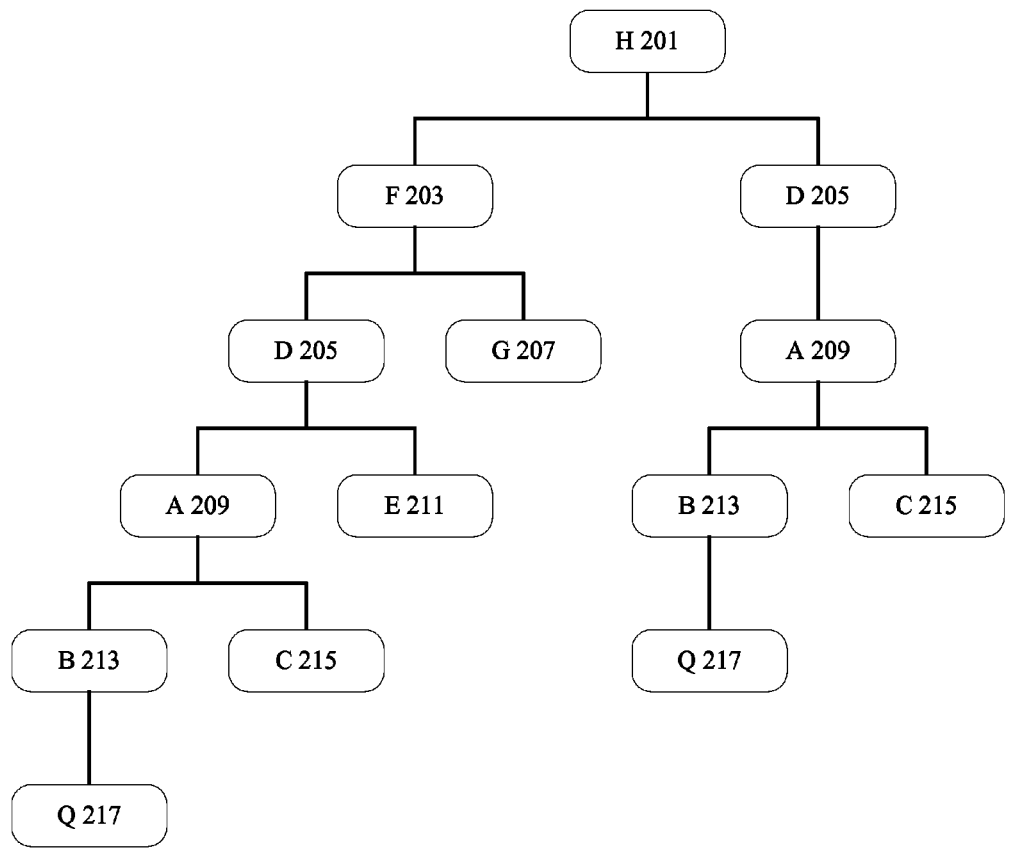
FIG. 2 illustrates one example of a tree.

FIG. 2 illustrates one example of a tree generated using the name set. Node H 201 has child nodes F 203 and D 205 in the right branch. Node D 205 has child node A 209. However, node D also has child node A 209 and child node E 211 in the left branch. Node A 209 has child nodes B 213 and C 215. Node B 213 has child node Q 217. In the left branch, node 203 F has child nodes D 205 and G 207. Node D 205 has child nodes A 209 and E 211. Node A 209 has child node B 213 and C 215. Node B 213 has child node Q 217. According to various embodiments, node A 209 has a sibling node E 211 in the left branch but no sibling in the right branch. Whether a node has a sibling is useful in determining short names for original names in a name set. It should be noted that although a directed graph and a tree are generated using a name set, other data structures and variations to the directed graph and tree can be used.

Figure 3:
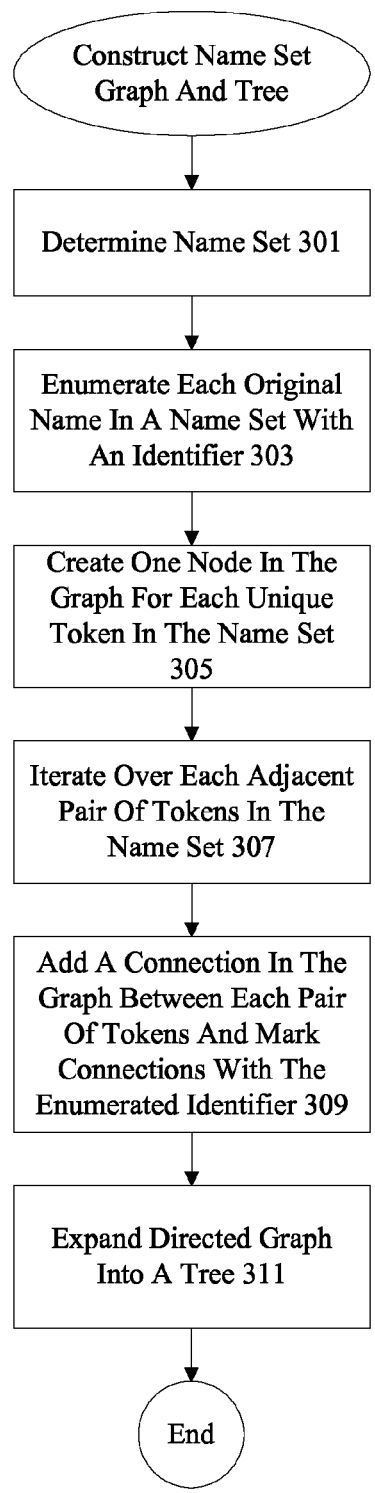
FIG. 3 illustrates a technique for generating direct graphs and trees.

FIG. 3 illustrates one technique for generating a directed graph and a tree. At 301, a name set is determined. According to various embodiments, a name set is the set of all names generated for a particular design for a synthesis tool. If a particular design changes, a name set may have to be regenerated. At 303, each original name in the name set is enumerated with an identifier. For example, original names may be enumerated in the following manner: 1—HFDABQ; 2—HFDAC; 3—HFDE; 4—HFG; 5—HDABQ; 6—HDAC. At 305, a node in the graph is created for each unique token in the name set. In particular embodiments, a process iterates over each adjacent pair of tokens in a name set at 307. According to various embodiments, a connection in the graph between each pair of tokens is added and connections are marked with the enumerated identifier at 309. According to various embodiments, the directed graph is also expanded into a tree at 311.

Figure 4:
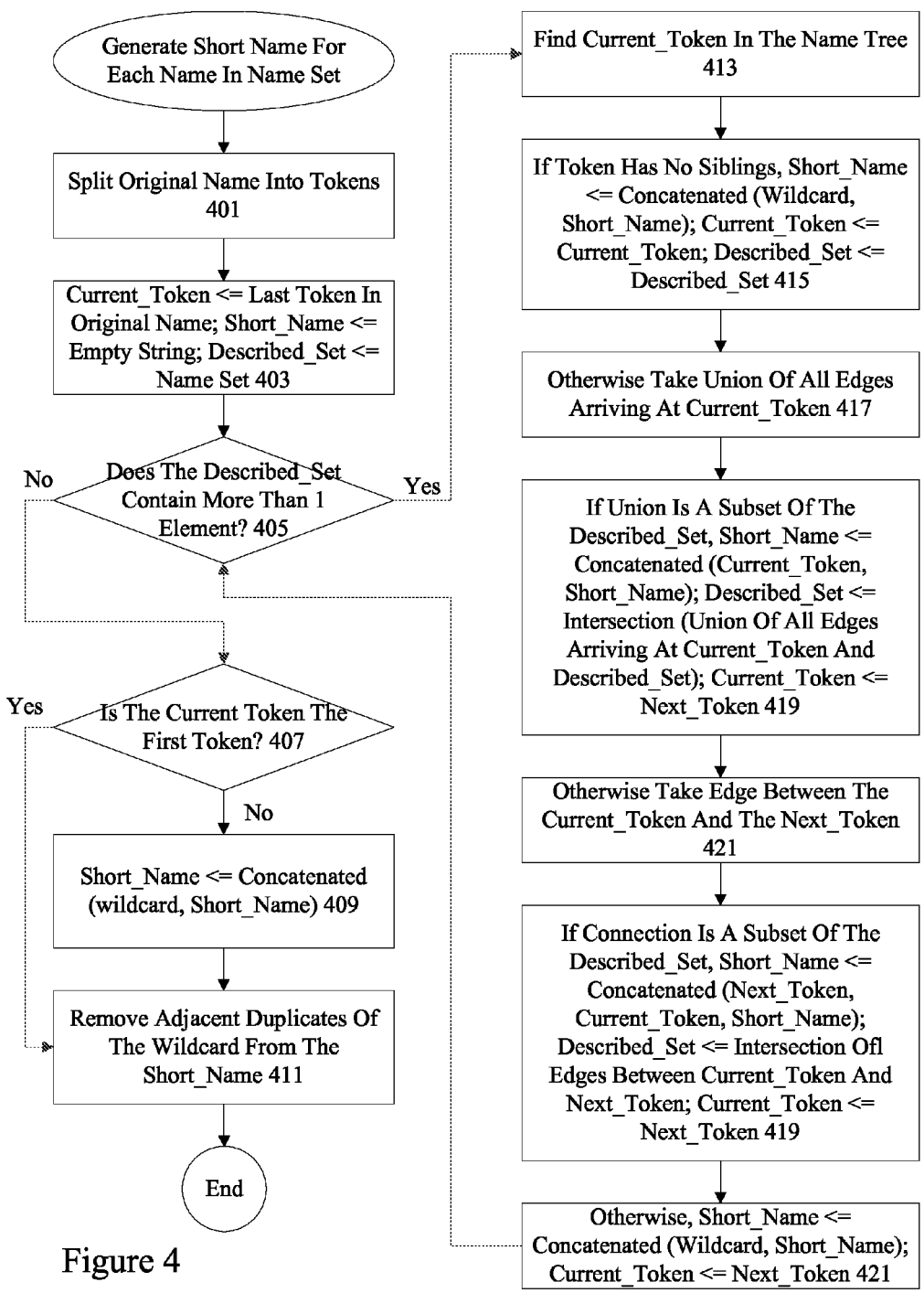
FIG. 4 illustrates a technique for generating readable hierarchical names.

FIG. 4 illustrates a technique for generating a short name for each name in the name set. According to various embodiments, the original name is split into tokens at 401. At 403, current_token<=last token in original name; short_name<=empty string; and described_set<=name set. While the described_set contains more than one element at 405, the current_token is located in the name tree at 413.

If the token has no siblings in the tree at 415, short_name<=concatenate (wildcard, short_name); current_token<=current_token; and described_set<=described_ set. Otherwise, the union of all edges arriving at the current_token is determined at 417. If this union is a subset of the described_set at 419, short_name<=concatenate (current_token, short_name); described_set<=intersection(union of all edges arriving at the current_token and described_set); and current_token<=next_token. Otherwise, the edge between the current_token and the next_token is determined at 421. If the connection is a subset of the described_set, short_name<=concatenate (next_token, current_token, short_name); current_token<=next_token; and described_set<=intersection of the edge between current_token and next_token. Otherwise, short_name<=concatenate (wildcard, short_name); current_token<=next_token; and described_set<=described_set and the process loops to element 405.

If the described_set now does not contain more than one element at 405, it is determined if the current_token is the first token 407. If the current token is not the first token, short_name<=concatenate (wildcard, short_name) at 409. At 411, any adjacent duplicates of the wildcard are removed from the short_name.

In one example, original name (H|F|D|A|B|Q) is enumerated as name 1. The original name is made of tokens "H" "F" "D" "A" "B" and "Q." The current token="Q," described_set=1, 2, 3, 4, 5, 6, and the unambiguous name is unassigned. The described set has more then 1 element. Since Q has no sibling, current Token="B," short_name=*, and the described_set=1, 2, 3, 4, 5, 6. The described set has more then 1 element, B has a sibling, and the union of all edges arriving at B is 1, 5. The current_token="A," short_name=B*, and described_set=1, 5. The described set has more then 1 element. A has a sibling. The union of all edges arriving at A is 1, 5 which is a subset of the described set. The edge between A and D has 1, 5. The current_token="D," short_name=*B*, and described_set=1, 5. The described set has more then 1 element. D has a sibling. The union of all edges arriving at D is 1, 2, 3, 5, 6 (which is not a subset of the described set). The edge between D and F has edges 1, 2, 3, current_token="F", short_name=FD*B*, described_set=1. The described set has more then 1 element. The process is not at the start so short_name=*FD*B*. There are no duplicates, so the short_name is *FD*B*.

The original names and the corresponding short names are shown as follows:

| 1 | HFDABQ - *FD*B* |
|---|---|
| 2 | HFDAC - *FD*C |
| 3 | HFDE - *E |
| 4 | HFG - *G |
| 5 | HDABQ - HD*B* |
| 6 | HDAC - HD*C |

For HDL designs specified in the form <entity>:<instance>, the <entity> section can be removed. Sparse sets of algorithms can improve the performance of the set comparisons needed in this algorithm.

Figure 5:
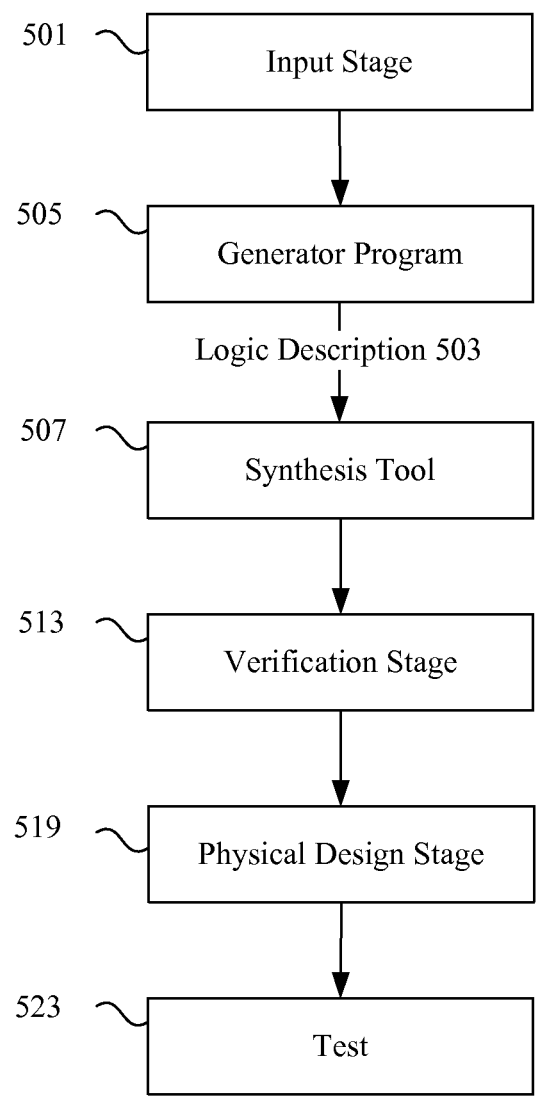
FIG. 5 illustrates one example of a design flow implementing a design entity having readable hierarchical names.

FIG. 5 is a diagrammatic representation showing implementation of an electronic device. An input stage 501 receives selection information typically from a user for logic such as a processor core as well as other components such as a streaming output device to be implemented on an electronic device. In one example, the input received is in the form of a high-level language program. A generator program 505 creates a logic description 503 and provides the logic description 503 along with other customized logic to any of a variety of synthesis tools, place and route programs, and logic configuration tools to allow a logic description to be implemented on an electronic device.

In one example, an input stage 501 often allows selection and parameterization of components to be used on an electronic device. The input stage 501 also allows configuration of variable or fixed latency support. In some examples, components provided to an input stage include intellectual property functions, megafunctions, and intellectual property cores. The input stage 501 may be a graphical user interface using wizards for allowing efficient or convenient entry of information. The input stage may also be a text interface or a program reading a data file such as a spreadsheet, database table, or schematic to acquire selection information. The input stage 501 produces an output containing information about the various modules selected.

In typical implementations, the generator program 505 can identify the selections and generate a logic description with information for implementing the various modules. The generator program 505 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 505 identifies pointers and provides ports for each pointer. One tool with generator program capabilities is System on a Programmable Chip (SOPC) Builder available from Altera Corporation of San Jose, Calif. The generator program 505 also provides information to a synthesis tool 507 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool 509.

As will be appreciated by one of skill in the art, the input stage 501, generator program 505, and synthesis tool 507 can be separate programs. The interface between the separate programs can be a database file, a log, or simply messages transmitted between the programs. For example, instead of writing a file to storage, the input stage 501 can send messages directly to the generator program 505 to allow the generator program to create a logic description. Similarly, the generator program can provide information directly to the synthesis tool instead of writing HDL files. Similarly, input stage 501, generator program 505, and synthesis tool 507 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 507.

A synthesis tool 507 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 513 typically follows the synthesis stage 507. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 513, the synthesized netlist file can be provided to physical design tools 519 including place and route and configuration tools. A place and route tool typically locates logic cells on specific logic elements of a target hardware device and connects wires between the inputs and outputs of the various logic elements in accordance with logic required to implement an electronic design. The device can also be physically tested at 523.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 501, the generator program 505, the synthesis tool 507, the verification tools 513, and physical design tools 519 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 6:
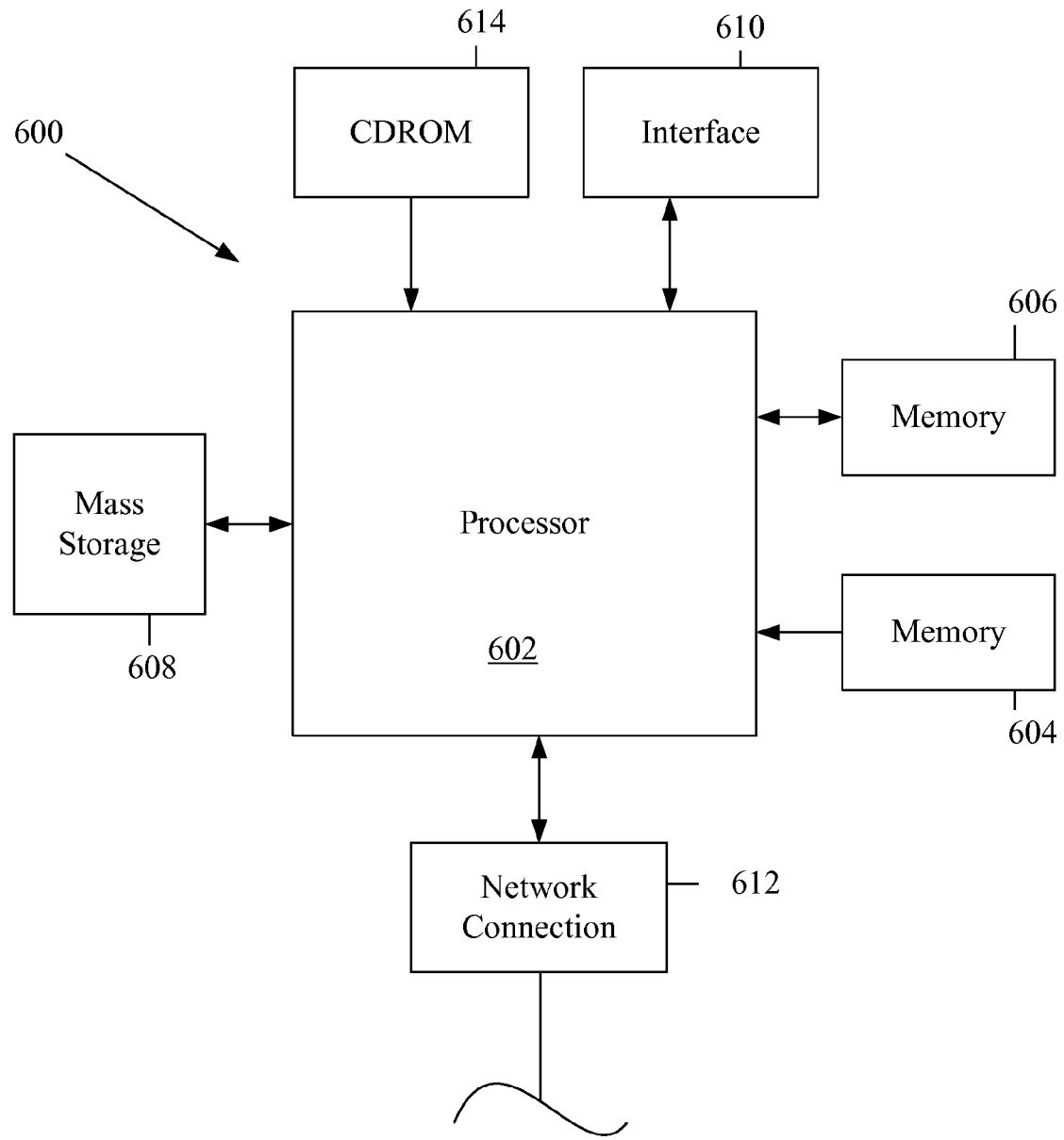
FIG. 6 illustrates one example of a computer system that can be used to generate readable hierarchical names.

FIG. 6 is a diagrammatic representation showing a typical computer system that can be used to implement a programmable chip having distinct cryptographic components, such as red and black isolation. The computer system 600 includes any number of processors 602 (also referred to as central processing units, or CPUs) that are coupled to devices including memory 606 (typically a random access memory, or "RAM"), memory 604 (typically a read only memory, or "ROM"). The processors 602 can be configured to generate an electronic design. As is well known in the art, memory 604 acts to transfer data and instructions uni-directionally to the CPU and memory 606 is used typically to transfer data and instructions in a bi-directional manner.

Both of these memory devices may include any suitable type of the computer-readable media described above. A mass storage device 608 is also coupled bi-directionally to CPU 602 and provides additional data storage capacity and may include any of the computer-readable media described above. The mass storage device 608 may be used to store programs, data and the like and is typically a secondary storage medium such as a hard disk that is slower than memory. The mass storage device 608 can be used to hold a library or database of prepackaged logic or intellectual property functions, as well as information on generating particular configurations. It will be appreciated that the information retained within the mass storage device 608, may, in appropriate cases, be incorporated in standard fashion as part of memory 606 as virtual memory. A specific mass storage device such as a CD-ROM 614 may also pass data uni-directionally to the CPU.

CPU 602 is also coupled to an interface 610 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 602 may be a design tool processor. Finally, CPU 602 optionally may be coupled to a computer or telecommunications network using a network connection as shown generally at 612. With such a network connection, it is contemplated that the CPU might receive information from the network, or might output information to the network in the course of performing the above-described process steps. It should be noted that the system 600 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of master and slave components and should not be restricted to the ones mentioned above. It is therefore intended that the invention be interpreted to include all variations and equivalents that fall within the true spirit and scope of the present invention.

What is claimed is:

1. A method, comprising:
   generating, for a hierarchical name set comprising a plurality of hierarchical names produced during hardware descriptor language (HDL) synthesis of a design, a directed graph and a tree using the hierarchical name set, wherein the directed graph and the tree each comprise a plurality of nodes, each of the plurality of hierarchical names includes a respective quantity of tokens, and each of the nodes corresponds to at least one of the respective quantity of tokens;

generating a respective hierarchical path identifier for an original name in the hierarchical name set by using the directed graph and the tree, wherein the original name includes a first quantity of tokens, and the respective hierarchical path identifier includes a subset of the first quantity of tokens that includes fewer tokens than the first quantity of tokens; and associating the original name in the hierarchical name set with the respective hierarchical path identifier.

2. The method of claim 1, wherein the respective hierarchical path identifier comprises an unambiguous reference to the respective original name.

3. The method of claim 1, wherein the respective hierarchical path identifier omits at least one token included in the respective original name.

4. The method of claim 1, wherein the design is configured for implementation on a programmable chip.

5. A system, comprising:

a processor configured to:

generate, for a hierarchical name set comprising a plurality of hierarchical names produced during hardware descriptor language (HDL) synthesis of a design, a directed graph and a tree using the hierarchical name set, wherein the directed graph and the tree each comprise a plurality of nodes, each of the plurality of hierarchical names includes a respective quantity of tokens, and each of the nodes corresponds to at least one of the respective quantity of tokens;

generate a respective hierarchical path identifier for an original name in the hierarchical name set by using the directed graph and the tree, wherein the original name includes a first quantity of tokens, and the respective hierarchical path identifier includes a subset of the first quantity of tokens that includes fewer tokens than the first quantity of tokens; and associate the original name in the hierarchical name set with the respective hierarchical path identifier.

6. The system of claim 5, wherein the respective hierarchical path comprises an unambiguous reference to the respective original name.

7. The system of claim 5, wherein the respective hierarchical path identifier omits at least one token included in the respective original name.

8. The system of claim 5, wherein the design is configured for implementation on a programmable chip.

9. A non-transitory computer readable storage medium having computer code embodied therein, the computer readable storage medium comprising:

computer code for generating, for a hierarchical name set comprising a plurality of hierarchical names produced during hardware descriptor language (HDL) synthesis of a design, a directed graph and a tree using the hierarchical name set, wherein the directed graph and the tree each comprise a plurality of nodes, each of the plurality of hierarchical names includes a respective quantity of tokens, and each of the nodes corresponds to at least one of the respective quantity of tokens;

computer code for generating a respective hierarchical path identifier for an original name in the hierarchical name set by using the directed graph and the tree, wherein the original name includes a first quantity of tokens, and the respective hierarchical path identifier includes a subset of the first quantity of tokens that includes fewer tokens than the first quantity of tokens; and associating the original name in the hierarchical name set with the respective hierarchical path identifier.

10. The non-transitory computer readable storage medium of claim 9, wherein the respective hierarchical path comprises an unambiguous reference to the respective original name.

11. The non-transitory computer readable storage medium of claim 9, wherein the respective hierarchical path identifier omits at least one token included in the respective original name.

* * * * *